US008043955B1

(12) United States Patent
Feldman-Peabody

(10) Patent No.: US 8,043,955 B1
(45) Date of Patent: Oct. 25, 2011

(54) METHODS OF FORMING A CONDUCTIVE TRANSPARENT OXIDE FILM LAYER FOR USE IN A CADMIUM TELLURIDE BASED THIN FILM PHOTOVOLTAIC DEVICE

(75) Inventor: Scott Daniel Feldman-Peabody, Golden, CO (US)

(73) Assignee: Primestar Solar, Inc., Arvada, CO (US)

( * ) Notice: Subject to any disclaimer, the term of this patent is extended or adjusted under 35 U.S.C. 154(b) by 0 days.

(21) Appl. No.: 12/750,136

(22) Filed: Mar. 30, 2010

(51) Int. Cl.
  *H01L 21/44* (2006.01)
(52) U.S. Cl. ........ 438/609; 136/256; 136/260; 136/264; 257/E21.159; 438/85; 438/98; 438/608
(58) Field of Classification Search .................. 136/256, 136/260, 264; 257/E21.159; 438/85, 98, 438/608, 609
See application file for complete search history.

(56) References Cited

U.S. PATENT DOCUMENTS

| 3,811,953 | A | 5/1974 | Nozik |
|---|---|---|---|
| 5,261,968 | A | 11/1993 | Jordan |
| 5,304,499 | A | 4/1994 | Bonnet et al. |
| 5,922,142 | A | 7/1999 | Wu et al. |
| 6,137,048 | A | 10/2000 | Wu et al. |
| 6,169,246 | B1 | 1/2001 | Wu et al. |
| 6,221,495 | B1 | 4/2001 | Wu et al. |
| 2005/0009228 | A1 | 1/2005 | Wu et al. |
| 2005/0224111 | A1 | 10/2005 | Cunningham et al. |
| 2008/0096376 | A1 | 4/2008 | Li et al. |
| 2009/0166616 | A1 | 7/2009 | Uchiyama |
| 2009/0194165 | A1 | 8/2009 | Murphy et al. |
| 2009/0272437 | A1 | 11/2009 | Roberts et al. |
| 2010/0032008 | A1 | 2/2010 | Adekore |

OTHER PUBLICATIONS

Coutts et al., "High—performance, Transpareny Conducting Oxides Based on Cadmium Stannate," Journal of Electronic Materials, vol. 25 (6), p. 935-943 (1996).*
English Abstract JP 2007278795, Published Oct. 25, 2007.
English Abstract KR 820001343, Published Jul. 28, 1982.

* cited by examiner

*Primary Examiner* — Asok Sarkar
(74) *Attorney, Agent, or Firm* — Dority & Manning, P.A.

(57) ABSTRACT

Methods are generally provided for forming a conductive oxide layer on a substrate. In one particular embodiment, the method can include sputtering a transparent conductive oxide layer (e.g., including cadmium stannate) on a substrate from a target in a sputtering atmosphere comprising cadmium. The transparent conductive oxide layer can be sputtered at a sputtering temperature greater of about 100° C. to about 600° C. Methods are also generally provided for manufacturing a cadmium telluride based thin film photovoltaic device.

19 Claims, 3 Drawing Sheets

_US 8,043,955 B1_

METHODS OF FORMING A CONDUCTIVE TRANSPARENT OXIDE FILM LAYER FOR USE IN A CADMIUM TELLURIDE BASED THIN FILM PHOTOVOLTAIC DEVICE

FIELD OF THE INVENTION

The subject matter disclosed herein relates generally to forming a conductive transparent oxide film layer. More particularly, the subject matter disclosed herein relates to methods of forming a conductive transparent oxide film layer for use in cadmium telluride thin film photovoltaic devices.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer).

A transparent conductive oxide ("TCO") layer is commonly used between the window glass and the junction forming layers. For example, the TCO layer may be sputtered from a cadmium stannate (i.e., $Cd_2SnO_4$) target by either of two processes: hot sputtering or cold sputtering. When hot sputtered, the TCO layer is typically deposited at sputtering temperatures above about 200° C. in a one step sputtering process. When cold sputtered (e.g., at about room temperature), the TCO layer must be annealed following sputtering of the layer in a second step to convert the layer from an amorphous layer to a crystalline layer.

Though the hot sputtering process is more streamlined (i.e., only requiring a single step), the hot sputtered TCO layers generally have a much higher resistivity than the cold sputtered TCO layers—even when sputtered the same material (e.g., cadmium stannate)—making the hot sputtered TCO layer less attractive for the end use. Although not wishing to be bound by any particular theory, it is believed that this difference in resistivities between the hot sputtered layer and the cold sputtered layer likely stems from a difference in the as-deposited stoichiometry. For example, when sputtering from a cadmium stannate target, it is presently believed that cold sputtering produces a layer having the stoichiometry $Cd_2SnO_4$, which is the desired stoichiometry for cadmium stannate. However, other processing issues exist that hinders the viability of cold sputtering to form the TCO layer, especially from a cadmium stannate target. First, the annealing process can sublimate cadmium atoms off of the TCO layer, altering the stoichiometry of the TCO layer, especially along its outer surface. Second, the annealing process can cause cracks and/or delamination of the TCO layer on the substrate, probably forming while increasing the substrate temperature from the sputtering temperature to the anneal temperature, while cooling from the anneal temperature back to room temperature, and/or from the phase change from amorphous to crystalline which also may result in a density/volume change. These two processing issues can lead to the stability problems in the TCO layers of the resulting PV devices, whereas such issues are not present in PV devices formed with TCO layers formed via hot sputtering.

On the other hand, hot sputtering from a cadmium stannate target is presently believed to produce a layer having the stoichiometry $CdSnO_3+SnO_2$. Thus, the TCO layer includes a deficiency of cadmium, when compared to stoichiometric cadmium stannate. This change in the as-deposited stoichiometry is believed to be a result of cadmium atoms sublimating off of the surface of the substrate during the hot sputtering process.

Thus, a need exists for a TCO layer having the conductivity of those cold sputtered layers with the processing and device stability found in those hot sputtered layers.

BRIEF DESCRIPTION OF THE INVENTION

Aspects and advantages of the invention will be set forth in part in the following description, or may be obvious from the description, or may be learned through practice of the invention.

Methods are generally provided for forming a conductive oxide layer on a substrate. In one particular embodiment, the method can include sputtering a transparent conductive oxide layer (e.g., including cadmium stannate) on a substrate from a target comprising in a stoichiometric amount that is more a standard stoichiometric amount of cadmium stannate. The transparent conductive oxide layer can be sputtered at a sputtering temperature greater of about 100° C. to about 600° C.

Methods are also generally provided for manufacturing a cadmium telluride based thin film photovoltaic device. For example, one particular embodiment of the method can include sputtering a transparent conductive oxide layer (e.g., including cadmium stannate) on a substrate from a target comprising in a stoichiometric amount that is more a standard stoichiometric amount of cadmium stannate. The transparent conductive oxide layer can be sputtered at a sputtering temperature greater of about 100° C. to about 600° C. A resistive transparent buffer layer can be formed over the transparent conductive oxide layer, and a cadmium sulfide layer can be formed over the resistive transparent layer. A cadmium telluride layer can be formed over the cadmium sulfide layer.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, directed to one of ordinary skill in the art, is set forth in the specification, which makes reference to the appended figures, in which.

Figure 1:
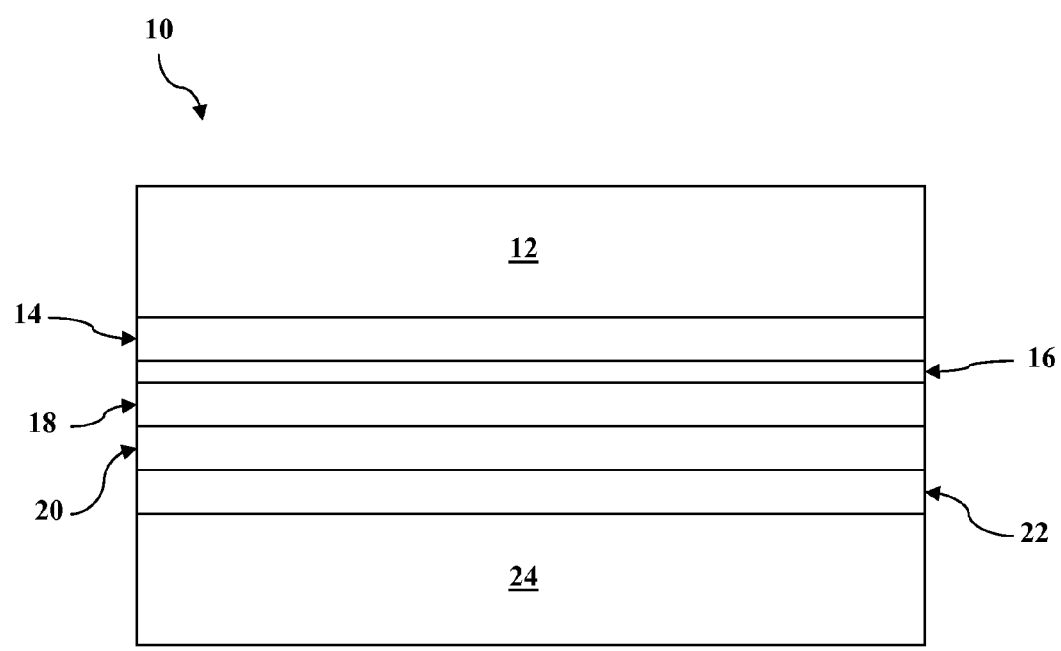
FIG. 1 shows a general schematic of a cross-sectional view of an exemplary cadmium telluride thin film photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Generally speaking, methods are generally disclosed for hot sputtering a transparent conductive oxide layer ("TCO layer") on a substrate from a target including cadmium in a stoichiometric amount that is more than a standard stoichiometric amount of cadmium stannate. The sputtering temperature for forming the TCO layer is relatively high, so that the sputtering method can be referred to as "hot sputtering". For example, the sputtering temperature of the substrate can be from about 100° C. to about 600° C., such as from about 150° C. to about 400° C. In one particular embodiment, the sputtering temperature can be from about 200° C. to about 300° C.

Without wishing to be bound by any particular theory, it is believed that the additional cadmium in the target can increase the stoichiometric amount of cadmium in the as-deposited TCO layer formed by hot sputtering so that the deposited layer includes a material close to the stoichiometric amount of cadmium stannate (e.g., $Cd_2SnO_4$). For example, the increased amount of cadmium in the target (when compared to a standard stoichiometric amount in a cadmium stannate target that has a 2 to 1 ratio of cadmium to tin) can provide an increased stoichiometric amount of cadmium to the sputtering chamber, helping to increase the cadmium content of the as-deposited hot sputtered TCO layer. Thus, the as-deposited TCO layer can have a stoichiometry having a ratio of at least about 1 to 1 for cadmium to tin, such as about 2 to about 1 for cadmium to tin.

The sputtering atmosphere can include an inert gases (e.g., argon, etc.) and/or reactive gases (e.g., oxygen, nitrogen, fluorine, etc., and mixtures thereof), depending on the type of target (i.e., metallic, ceramic, etc.). The overall pressure of the sputtering atmosphere during sputtering can be from about 1 mTorr to about 100 mTorr (e.g., from about 2 mTorr to about 20 mTorr, such as from about 1 mTorr to about 10 mTorr). Cadmium can constitute any portion of the total sputtering pressure suitable to inhibit cadmium from sublimating off of the surface of the substrate during deposition of the TCO layer. For example, cadmium can constitute about 0.1% to about 25% by volume of the sputtering atmosphere, such as about 1% to about 15% of the sputtering atmosphere.

Sputtering deposition generally involves ejecting material from a target, which is the material source, and depositing the ejected material onto the substrate to form the film. DC sputtering generally involves applying a direct current to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. Other inert gases (e.g., argon, etc.) may also be present. The pressure of the reactive atmosphere can be between about 1 mTorr and about 20 mTorr for magnetron sputtering. The pressure can be even higher for diode sputtering (e.g., from about 25 mTorr to about 100 mTorr). When metal atoms are released from the target upon application of the voltage, the metal atoms deposit onto the surface of the substrate. For example, when the atmosphere contains oxygen, the metal atoms released from the metal target can form a metallic oxide layer on the substrate. The current applied to the source material can vary depending on the size of the source material, size of the sputtering chamber, amount of surface area of substrate, and other variables. In some embodiments, the current applied can be from about 2 amps to about 20 amps. Conversely, RF sputtering involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) which may or may not contain reactive species (e.g., oxygen, nitrogen, etc.) having a pressure between about 1 mTorr and about 20 mTorr for magnetron sputtering. Again, the pressure can be even higher for diode sputtering (e.g., from about 25 mTorr to about 100 mTorr).

Figure 3:
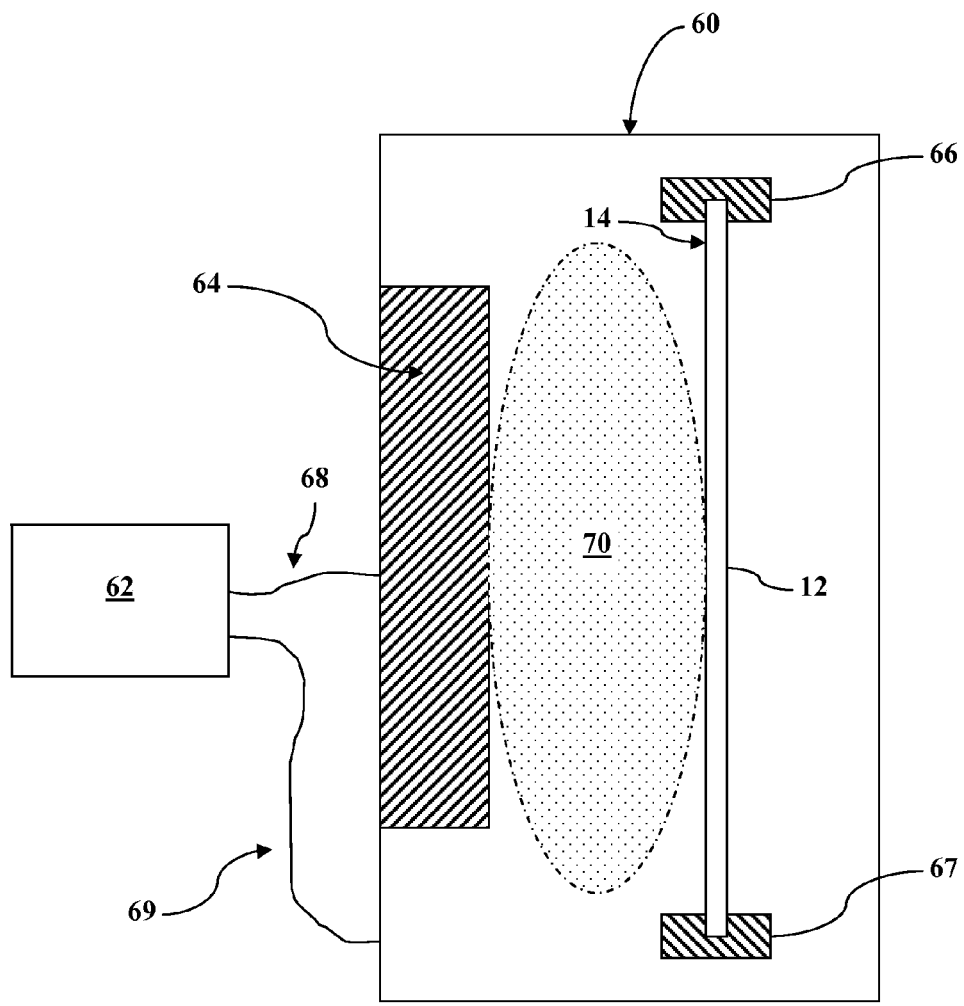

FIG. 3 shows a general schematic as a cross-sectional view of an exemplary DC sputtering chamber 60 according to one embodiment of the present invention. A DC power source 62 is configured to control and supply DC power to the chamber 60. As shown, the DC power source applies a voltage to the cathode 64 to create a voltage potential between the cathode 64 and an anode formed by the chamber wall, such that the substrate is in between the cathode and anode. The glass substrate 12 is held between top support 66 and bottom support 67 via wires 68 and 69, respectively. Generally, the glass substrate is positioned within the sputtering chamber 60 such that the TCO layer 14 is formed on the surface facing the cathode 64.

A plasma field 70 is created once the sputtering atmosphere is ignited, and is sustained in response to the voltage potential between the cathode 64 and the chamber wall acting as an anode. The voltage potential causes the plasma ions within the plasma field 70 to accelerate toward the cathode 64, causing atoms from the cathode 64 to be ejected toward the surface on the glass substrate 12. As such, the cathode 64 can be referred to as a "target" and acts as the source material for the formation of the TCO layer 14 on the surface facing the cathode 64. The cathode 64 can be a metal alloy target, such as elemental tin, elemental zinc, or mixtures thereof. Additionally, in some embodiments, a plurality of cathodes 64 can be utilized. A plurality of cathodes 64 can be particularly useful to form a layer including several types of materials (e.g., co-sputtering). Since the sputtering atmosphere contains oxygen gas, oxygen particles of the plasma field 70 can react with the ejected target atoms to form an oxide layer on the TCO layer 14 on the glass substrate 12.

Although only a single DC power source 62 is shown, the voltage potential can be realized through the use of multiple power sources coupled together. Additionally, the exemplary sputtering chamber 60 is shown having a vertical orientation, although any other configuration can be utilized.

For example, the TCO layer can be formed via sputtering at the specified sputtering temperature from a metal target to form a TCO layer on the substrate in an atmosphere containing an inert gas (e.g., argon) and oxygen (e.g., about 5% to about 20% by volume oxygen). The metal target can be formed from a mixture of cadmium and tin having the formula $Cd_xSn$, where x is greater than about 2, such as about 4 to about 10 (e.g., about 6 to about 10, such as about 8). In other words, the metal target can include cadmium and tin in greater than a 2 to 1 stoichiometric ratio, such a 4 to 1 stoichiometric ratio (which is twice or more the standard stoichiometric ratio of 2 to 1 of cadmium to tin for cadmium stannate), such as about 4:1 to about 10:1. For example, the metal target can include cadmium and tin in a stoichiometric ratio of about 6:1 to about 10:1. As used herein, the term "standard stoichiometric ratio of cadmium stannate" refers to a ratio of 2 to 1 of cadmium to tin to form standard cadmium stannate (i.e., $Cd_2SnO_4$).

A stoichiometric ratio of cadmium and tin can be, in one particular embodiment, about 8 to 1 (i.e., $Cd_8Sn$) when it is desired to form a TCO layer of cadmium stannate via hot sputtering. In this embodiment, the desired stoichiometric ratio of cadmium stannate (i.e., $Cd_2SnO_4$) in the as-deposited TCO layer is about 2 to about 1 for cadmium to tin. However, since currently hot sputtered TCO layers from a metal target of cadmium to tin in a stoichiometric ratio of 2 to 1 in an oxygen containing atmosphere is believed to form $CdSn_2O_5$ (i.e., a stoichiometric ratio of about 1 to 2 of cadmium to tin), increasing the cadmium content of the metal target to a ratio of about 8 to 1 of cadmium to tin can negate the apparent loss of cadmium during the hot sputtering process from a stoichiometric cadmium stannate. Thus, the as-deposited TCO layer can be essentially cadmium stannate (i.e., $Cd_2SnO_4$).

Alternatively, the TCO layer can be formed via sputtering at the specified sputtering temperature from a ceramic target to form a TCO layer on the substrate in an atmosphere containing an inert gas with or without the presence of oxygen. The additional cadmium in the ceramic target can be provided in the form of cadmium oxide, cadmium sulfide, or other suitable cadmium materials, or combinations or mixtures thereof. For example, the ceramic target can be formed from cadmium stannate (i.e., $Cd_2SnO_4$) and another cadmium ceramic material. Suitable cadmium ceramic material that can be combined with cadmium stannate to form the ceramic target include, but are not limited to, cadmium oxide (i.e., CdO), cadmium sulfide (i.e., CdS), etc., or combinations and mixtures thereof. For example, cadmium oxide and/or cadmium sulfide can be added to cadmium stannate, for instance in a stoichiometric amount of about 2 to about 10, such as from about 4 to about 8. In one particular embodiment, cadmium oxide and/or cadmium sulfide can be added to cadmium stannate in a stoichiometric amount of about 6, increasing the cadmium content of the ceramic target to a ratio of about 8 to 1 of cadmium to tin to negate the apparent loss of cadmium during the hot sputtering process of a stoichiometric cadmium stannate ratio. Thus, the as-deposited TCO layer can be essentially cadmium stannate (i.e., $Cd_2SnO_4$). In other words, the target can be formed from cadmium stannate and cadmium oxide and/or cadmium sulfide according to the formula:

$$Cd_2SnO_4 + xCdO + yCdS$$

where x is 0 to about 10, y is 0 to about 10, and (x+y) is greater than 0, such as about 2 to about 10. For example, x can be 0 to about 8, y can be 0 to about 8, and (x+y) can be about 4 to about 8. In particular embodiments, (x+y) can be about 6.

In one embodiment, the ceramic target can be from cadmium stannate and cadmium oxide according to the formula:

$$Cd_2SnO_4 + xCdO$$

where x is greater than 0 to about 10. In particular embodiments, x can be about 2 to about 8, such as about 6.

Alternatively, in one embodiment, the ceramic target can be from cadmium stannate and cadmium sulfide according to the formula:

$$Cd_2SnO_4 + yCdS$$

where y is greater than 0 to about 10, such as about 2 to about 8. In particular embodiments, y can be about 4 to about 8, such as about 6.

Of course, the target may include other metals, oxides, ceramics, and/or additional materials (e.g., zinc stannate, etc.).

The presently provided methods of sputtering a TCO layer can be utilized in the formation of any film stack that utilizes a TCO layer, particularly those including a cadmium stannate TCO layer. For example, the TCO layer can be used during the formation of any cadmium telluride device that utilizes a cadmium telluride layer, such as in the cadmium telluride thin film photovoltaic device disclosed in U.S. Publication No. 2009/0194165 of Murphy, et al. titled "Ultra-high Current Density Cadmium Telluride Photovoltaic Modules."

FIG. 1 represents an exemplary cadmium telluride thin film photovoltaic device 10 that can be formed according to methods described herein. The exemplary device 10 of FIG. 1 includes a top sheet of glass 12 employed as the substrate. In this embodiment, the glass 12 can be referred to as a "superstrate", as it is the substrate on which the subsequent layers are formed even though it faces upward to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.015% by weight iron (Fe), and may have a transmissiveness of about 0.9 or greater in the spectrum of interest (e.g., wavelengths from about 300 nm to about 900 nm). In another embodiment, borosilicate glass may be utilized so as to better withstand high temperature processing.

The transparent conductive oxide (TCO) layer 14 is shown on the glass 12 of the exemplary device 10 of FIG. 1. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). In certain embodiments, the TCO layer 14 can have a thickness between about 0.1 μm and about 1 μm, for example from about 0.1 μm to about 0.5 μm, such as from about 0.25 μm to about 0.35 μm.

A resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 22. Thus, it is believed that the RTB layer 16 allows for improved adhesion and/or interaction between the TCO layer 14 and the cadmium telluride layer 22, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering (e.g. DC sputtering or RF sputtering) on the TCO layer 14 (as discussed below in greater detail with respect to the deposition of the cadmium sulfide layer 18). For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

A cadmium sulfide layer 18 is shown on RTB layer 16 of the exemplary device 10 of FIG. 1. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering (e.g., radio frequency (RF) sputtering) on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 μm, such as between about 10 nm and about 100 nm, such as from about 50 nm to about 80 nm, with a minimal presence of pinholes between the resistive transparent layer 16 and the cadmium sulfide layer 18. Additionally, a cadmium sulfide layer 18 having a thickness less than about 0.1 μm reduces any absorption of radiation energy by the cadmium sulfide layer 18, effectively increasing the amount of radiation energy reaching the underlying cadmium telluride layer 22.

A cadmium telluride layer 20 is shown on the cadmium sulfide layer 18 in the exemplary cadmium telluride thin film photovoltaic device 10 of FIG. 1. The cadmium telluride layer 20 is a p-type layer that generally includes cadmium telluride (CdTe) but may also include other materials. As the p-type layer of device 10, the cadmium telluride layer 20 is the photovoltaic layer that interacts with the cadmium sulfide layer 18 (i.e., the n-type layer) to produce current from the absorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 2 µm and about 4 such as about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layer(s) 22. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally lightly p-type doped, or even n-type doped cadmium telluride layer 20 to a more strongly p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride and then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as $CdO$, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

A back contact layer 22 is shown on the cadmium telluride layer 20. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, aluminum, gold, silver, technetium or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 µm to about 10 µm in thickness, for example from about 1 µm to about 5 µm. A metal layer of the back contact, if used for or as part of the back contact layer 22, can be from about 0.1 µm to about 1.5 µm in thickness.

The encapsulating glass 24 is also shown in the exemplary cadmium telluride thin film photovoltaic device 10 of FIG. 1.

Other components (not shown) can be included in the exemplary device 10, such as bus bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 2:
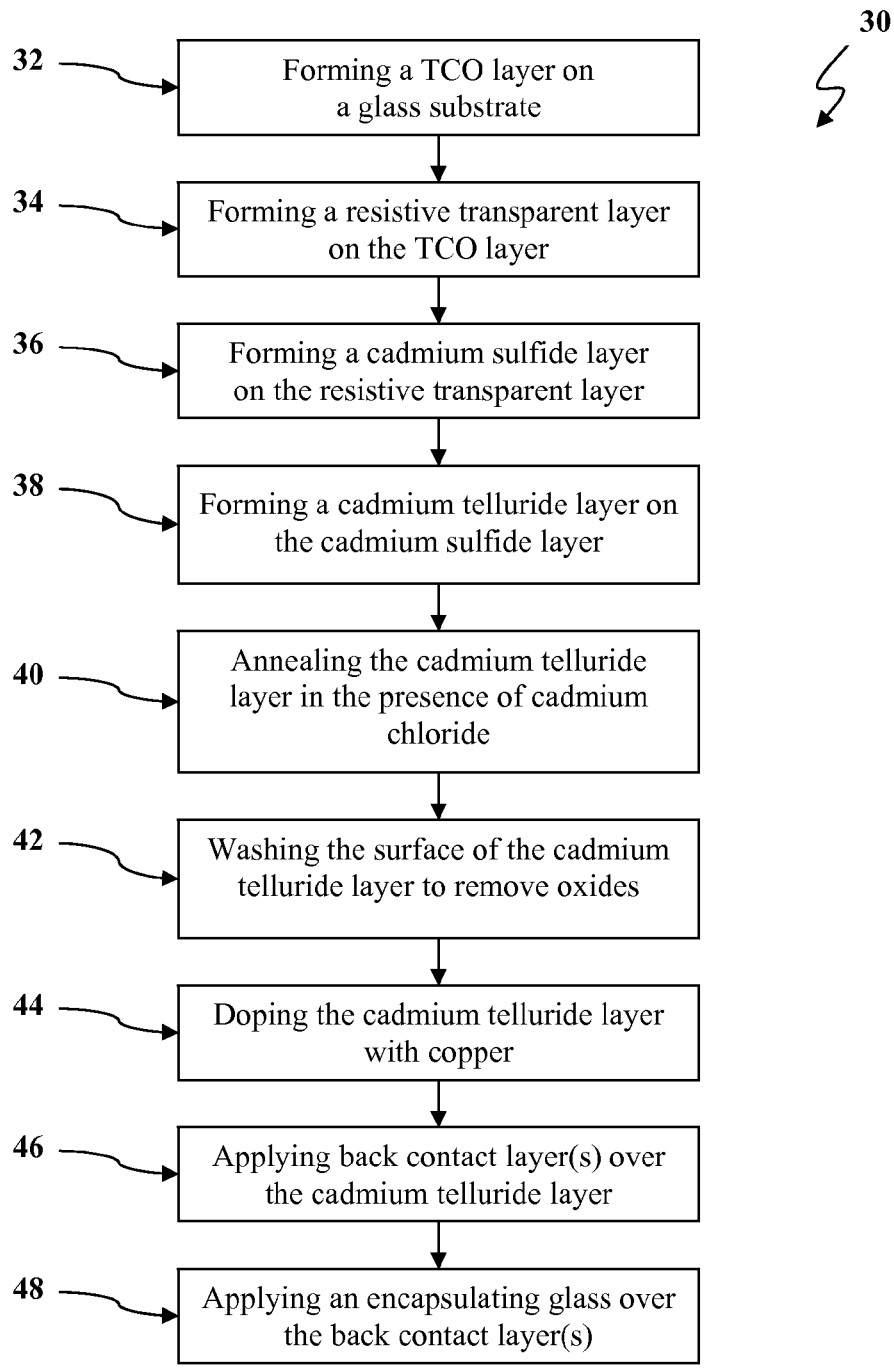
FIG. 2 shows a flow diagram of an exemplary method of manufacturing a photovoltaic module including a cadmium telluride thin film photovoltaic device; and, FIG. 3 shows a general schematic of a cross-sectional view of an exemplary DC sputtering chamber according to one embodiment of the present invention.

FIG. 2 shows a flow diagram of an exemplary method 30 of manufacturing a photovoltaic device according to one embodiment of the present invention. According to the exemplary method 30, a TCO layer is formed on a glass substrate at 32. At 34, a resistive transparent layer is formed on the TCO layer. A cadmium sulfide layer is formed on the resistive transparent layer at 36, and a cadmium telluride layer is formed on the cadmium sulfide layer at 38. The cadmium telluride layer can be annealed in the presence of cadmium chloride at 40, and washed to remove oxides formed on the surface at 42. The cadmium telluride layer can be doped with copper at 44. At 46, back contact layer(s) can be applied over the cadmium telluride layer, and an encapsulating glass can be applied over the back contact layer at 48.

One of ordinary skill in the art should recognize that other processing and/or treatments can be included in the method 30. For instance, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for forming a conductive oxide layer on a substrate, the method comprising:
   sputtering a ceramic target to deposit a transparent conductive oxide layer on a substrate, the ceramic target comprising cadmium, tin, and oxygen, wherein cadmium is present in the ceramic target in a stoichiometric amount that is greater than a standard stoichiometric amount of cadmium stannate, wherein the transparent conductive oxide layer is deposited at a sputtering temperature of about 100° C. to about 600° C.

2. The method as in claim 1, wherein the ceramic target comprises:

$Cd_2SnO_4 + xCdO + yCdS$ where x is 0 to about 10, y is 0 to about 10, and (x+y) is greater than 0 to about 10.

3. The method as in claim 2, wherein x is 0 to about 8, y is 0 to about 8, and (x+y) is about 2 to about 8.

4. The method as in claim 2, wherein the transparent conductive oxide layer is deposited in a sputtering atmosphere comprising an inert gas.

5. The method as in claim 4, wherein the sputtering atmosphere further comprises oxygen.

6. The method as in claim 1, wherein the ceramic target comprises:

$Cd_2SnO_4 + xCdO$ where x is greater than 0 to about 10.

7. The method as in claim 6, wherein x is about 2 to about 8.

8. The method as in claim 1, wherein the ceramic target comprises:

$Cd_2SnO_4 + yCdS$ where y is greater than 0 to about 10.

9. The method as in claim 8, wherein y is about 2 to about 8.

10. The method as in claim 1, wherein the sputtering atmosphere has a pressure from about 1 mTorr to about 100 mTorr.

11. The method as in claim 1, wherein the sputtering temperature is from about 150° C. to about 500° C.

12. A method for forming a conductive oxide layer on a substrate, the method comprising:
    sputtering a metal target to deposit a transparent conductive oxide layer on a substrate, wherein the transparent conductive oxide layer is deposited at a sputtering temperature of about 100° C. to about 600° C., wherein the metal target consists essentially of cadmium and tin according to the formula: $Cd_xSn$, wherein x is 4 to 10.

13. The method as in claim 12, wherein the transparent conductive oxide layer is deposited in a sputtering atmosphere comprising oxygen.

14. The method as in claim 12, wherein the sputtering temperature is from about 150° C. to about 500° C.

15. The method as in claim 12, further comprising:
    forming a resistive transparent buffer layer over the transparent conductive oxide layer;
    forming a cadmium sulfide layer over the resistive transparent layer; and,
    forming a cadmium telluride layer over the cadmium sulfide layer.

16. A method for manufacturing a cadmium telluride based thin film photovoltaic device, the method comprising:
    sputtering a ceramic target to deposit a transparent conductive oxide layer on a substrate, the ceramic target comprising cadmium, tin, and oxygen, wherein cadmium is present in the ceramic target in a stoichiometric amount that is greater than a standard stoichiometric amount of cadmium stannate, wherein the transparent conductive oxide layer is deposited at a sputtering temperature of about 100° C. to about 600° C.;
    forming a resistive transparent buffer layer over the transparent conductive oxide layer;
    forming a cadmium sulfide layer over the resistive transparent layer; and,
    forming a cadmium telluride layer over the cadmium sulfide layer.

17. The method as in claim 16, wherein the target is a ceramic target comprises:

$Cd_2SnO_4 + xCdO + yCdS$ where x is 0 to about 10, y is 0 to about 10, and (x+y) is greater than 0 to about 10.

18. The method as in claim 16, wherein the target is a ceramic target comprising:

$Cd_2SnO_4 + xCdO$ where x is greater than 0 to about 10.

19. The method as iii claim 16, wherein the target is a ceramic target comprising:

$Cd_2SnO_4 + yCdS$ where y is greater than 0 to about 10.

* * * * *